United States Patent [19]

Ishikawa et al.

[11] Patent Number: 5,555,116
[45] Date of Patent: Sep. 10, 1996

[54] LIQUID CRYSTAL DISPLAY HAVING ADJACENT ELECTRODE TERMINALS SET EQUAL IN LENGTH

[75] Inventors: Takehiro Ishikawa; Takashi Date; Fumihiko Sagawa, all of Iwaki, Japan

[73] Assignee: Alps Electric Co., Ltd., Tokyo, Japan

[21] Appl. No.: 289,357

[22] Filed: Aug. 11, 1994

[30] Foreign Application Priority Data

Aug. 23, 1993 [JP] Japan ................... 5-207843

[51] Int. Cl.⁶ .................... G02F 1/1345; G02F 1/1343
[52] U.S. Cl. .................... 359/88; 359/54
[58] Field of Search ................... 359/88, 87, 54

[56] References Cited

U.S. PATENT DOCUMENTS

| | | | |
|---|---|---|---|
| 4,836,651 | 6/1989 | Anderson | 350/334 |
| 4,838,656 | 6/1989 | Stoddard | 359/87 |
| 5,283,677 | 2/1994 | Sagawa et al. | 359/88 |
| 5,499,131 | 3/1996 | Kim | 359/88 |

FOREIGN PATENT DOCUMENTS

| | | | |
|---|---|---|---|
| 64-59319 | 3/1989 | Japan | 359/88 |
| 5-203997 | 8/1993 | Japan | 359/54 |
| 6-138472 | 5/1994 | Japan | |

*Primary Examiner*—Anita Pellman Gross
*Assistant Examiner*—Charles Miller
*Attorney, Agent, or Firm*—Guy W. Shoup; Patrick T. Bever

[57] ABSTRACT

Disclosed herein is a liquid crystal display which can eliminate the nonuniformity of display contrast due to a difference in wiring resistance between electrode terminals of a liquid crystal panel. Two adjacent ones of the electrode terminals which are respectively connected to two adjacent ones of tape carriers are set substantially equal in length. Furthermore, two adjacent ones of the electrode terminals which are respectively connected to two of lead wires adjacent to each other with a lead pitch increased area interposed therebetween are set substantially equal in length.

6 Claims, 2 Drawing Sheets

LIQUID CRYSTAL DISPLAY HAVING ADJACENT ELECTRODE TERMINALS SET EQUAL IN LENGTH

BACKGROUND OF THE INVENTION

1. Field of the Invention

The present invention relates to a liquid crystal display in which a tape carrier having an IC mounted thereon is arranged on an edge portion of a liquid crystal panel, and a lead wire on the tape carrier is connected to an electrode terminal on the liquid crystal panel.

2. Description of the Related Art

In general, a dot matrix type of liquid crystal display has a structure such that a plurality of electrode patterns extending in two directions perpendicular to each other are formed on opposed surfaces of an upper glass substrate and a lower glass substrate of a liquid crystal panel, and a plurality of electrode terminals extending from the electrode patterns (a common electrode and many segment electrode patterns) extending in the row direction or the column direction are formed on an edge portion of each glass substrate. Further, a plurality of tape carriers (also called tape carrier packages) are suitably arranged on the edge portion of each glass substrate. Each tape carrier includes a flexible substrate, an IC chip mounted on the flexible substrate, and a plurality of lead wires formed on the flexible substrate. The lead wires at one end portion of each tape carrier are connected through anisotropic conductive adhesive or the like to the electrode terminals on the corresponding glass substrate. The lead wires at the other end portion of each tape carrier are connected to a control circuit such as a printed wiring board. Thus, the liquid crystal panel is driven by the IC chip.

In the case where 480 electrode terminals are formed on the edge portion of the liquid crystal panel along one end line thereof and 100 output terminals are formed on each tape carrier, for example, a conventional arrangement is such that five tape carriers each having this structure are juxtaposed at equal intervals on the edge portion of the liquid crystal panel to connect the lead wires and the electrode terminals. In this case, the total number of the output terminals that can be used on all the tape carriers is greater than the total number of the electrode terminals to be connected. Accordingly, a few unused lead wires not connected to the electrode terminals are present on a part of the tape carriers, and these unused lead wires may be considered as dummy patterns.

In such a liquid crystal display wherein a plurality of tape carriers each having a plurality of lead wires are juxtaposed on an edge portion of a liquid crystal panel having a plurality of electrode terminals to connect the lead wires of each carrier tape to the electrode terminals of the liquid crystal panel, a pitch of the lead wires must be made smaller than a pitch of the electrode terminals. Accordingly, the electrode terminals are wired in a manner as shown in FIG. 3. That is, a plurality of electrode terminals 2 of a liquid crystal panel 1 are wired so as to converge toward a corresponding tape carrier 4 having a plurality of lead wires 5 to be connected to these electrode terminals 2. When a plurality of tape carriers 4 are juxtaposed at equal intervals on the edge portion of the liquid crystal panel 1 as mentioned above, two of the electrode terminals 2 which are adjacent to each other but connected to two adjacent ones of the tape carriers 4 (i.e., two electrode terminals 2a and 2b or 2c and 2d in FIG. 3) cannot be set in line symmetry. Thus, the two adjacent electrode terminals 2 are unavoidably unbalanced in a wiring form in such a manner that the electrode terminal 2a becomes considerably longer than the electrode terminal 2b, for example. Such a large difference in length between the two adjacent terminals 2 causes a large difference in wiring resistance therebetween. As a result, there occurs nonuniformity of display contrast between adjacent pixels formed by adjacent electrode patterns 3 extended to the two adjacent electrode terminals 2.

Further, in the case where unused lead wires not connected to the electrode terminals 2 are present on the tape carriers 4 arranged on the edge portion of the liquid crystal panel 1, a portion of a certain one of the tape carriers 4 for forming the unused lead wires is formed as a lead pitch increased area 7 in which a pitch of the unused lead wires is locally increased over a pitch of the lead wires 5 connected to the electrode terminals 2. Conventionally, no attention is paid to a difference in length between two adjacent electrode terminals 2m and 2n respectively connected to two lead wires 5a and 5b adjacent to each other with the lead pitch increased area 7 interposed therebetween. Accordingly, the electrode terminal 2m becomes considerably longer than the electrode terminal 2n as shown in FIG. 3, causing a large difference in wiring resistance between the two adjacent electrode terminals 2m and 2n. As a result, there is a possibility that nonuniformity of display contrast may occur between adjacent pixels formed by adjacent electrode patterns 3 extended to the two adjacent electrode terminals 2m and 2n.

In FIG. 3, reference numeral 6 denotes an IC chip mounted on each tape carrier 4 to drive the liquid crystal panel 1. The IC chip 6 is connected to the lead wires 5 formed on the corresponding tape carrier 4.

SUMMARY OF THE INVENTION

It is accordingly an object of the present invention to provide a liquid crystal display which can eliminate the nonuniformity of display contrast due to a difference in wiring resistance between adjacent electrodes of a liquid crystal panel.

According to the present invention, there is provided in a liquid crystal display including a liquid crystal panel having a plurality of electrode patterns and a plurality of electrode terminals respectively extending from the electrode patterns, the electrode terminals being formed on an edge portion of the liquid crystal panel, and further including a plurality of tape carriers juxtaposed on the edge portion of the liquid crystal panel, each of the tape carriers having an IC mounted thereon for driving the liquid crystal panel, the electrode terminals being connected to a plurality of lead wires formed on one end portion of the each tape carrier; the improvement wherein two adjacent ones of the electrode terminals respectively connected to two adjacent ones of the tape carriers are set substantially equal in length. The setting of the equal length is effected preferably by arranging the two adjacent electrode terminals in line symmetry. Further, in the case where at least one of the tape carriers has a lead pitch increased area in which a pitch of some of the lead wires is greater than that of the other lead wires formed outside of this area, there is provided the improvement wherein two adjacent ones of the electrode terminals respectively connected to two of the lead wires adjacent to each other with the lead pitch increased area interposed therebetween are set substantially equal in length. Also in this case, the setting of the equal length is effected preferably by arranging the two adjacent electrode terminals in line symmetry.

In the present invention, the specific ones of the electrode terminals of the liquid crystal panel which are adjacent to each other but possibly largely different in length in the related art are set substantially equal in length, thereby almost eliminating a difference in wiring resistance. Therefore, the nonuniformity of display contrast due to the difference in wiring resistance is not generated between adjacent pixels formed by the adjacent electrode patterns extended to the specific electrode terminals.

Other objects and features of the invention will be more fully understood from the following detailed description and appended claims when taken with the accompanying drawings.

DETAILED DESCRIPTION OF THE PREFERRED EMBODIMENTS

Figure 1:
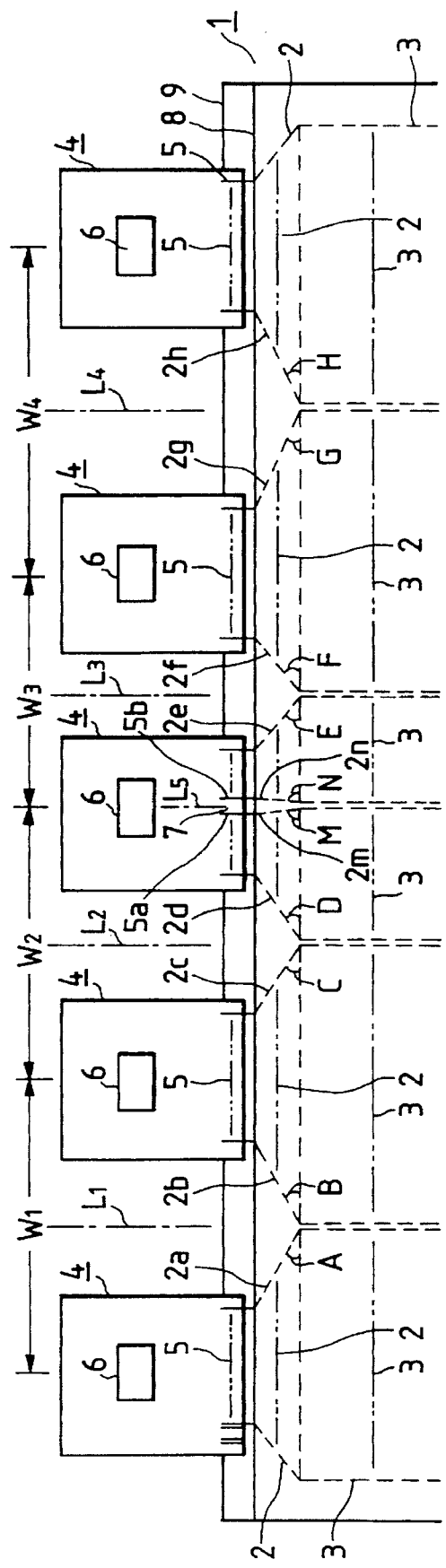
FIG. 1 is a plan view of an essential part of a liquid crystal display according to a preferred embodiment of the present invention.
Figure 2:
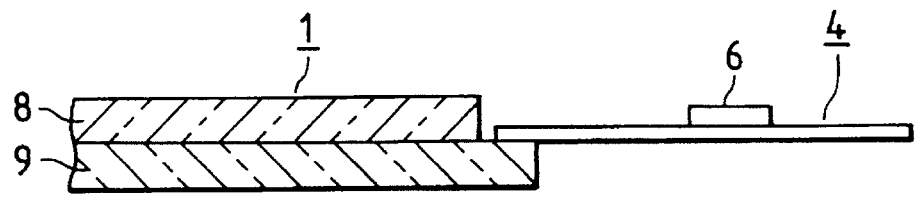
FIG. 2 is a side view of the essential part shown in FIG. 1.
Figure 3:
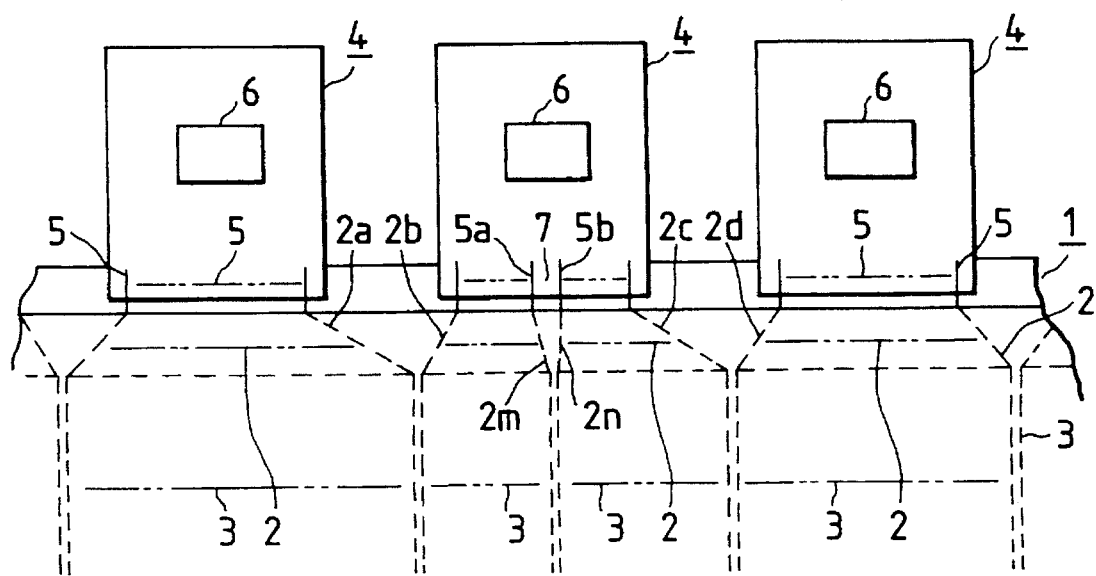
FIG. 3 is a partially cutaway, perspective view illustrating a liquid crystal display in the related art.

A preferred embodiment of the present invention will now be described with reference to FIGS. 1 and 2. FIG. 1 is a plan view of an essential part of a liquid crystal display according to the preferred embodiment, and FIG. 2 is a side view of the essential part shown in FIG. 1. In these drawings, parts corresponding to those shown in FIG. 3 illustrating the related art are denoted by the same reference numerals.

Referring to FIGS. 1 and 2, reference numeral 1 generally denotes a dot matrix type of liquid crystal panel having an upper glass substrate 8 and a lower glass substrate 9 with a liquid crystal sealed therebetween and being provided with a polarizing plate etc. not shown. A plurality of electrode patterns 3 and electrode terminals 2 of ITO etc. are formed on both the glass substrates 8 and 9 of the liquid crystal panel 1. That is, the electrode patterns 3 extending in two directions perpendicular to each other are formed on opposed surfaces of the glass substrates 8 and 9, and the electrode terminals 2 extending from the electrode patterns 3 extending in the row direction or the column direction are formed on an edge portion of the glass substrate 8 or 9 (For simplicity of illustration, the electrode terminals 2 and the electrode patterns 3 on the upper glass substrate 8 are omitted from FIG. 1). Reference numerals 4 denote a plurality of tape carriers juxtaposed on the edge portion of the liquid crystal panel 1, on each of which an IC chip 6 for driving the liquid crystal panel 1 is mounted. A plurality of lead wires 5 are formed on each tape carrier 4 by etching a copper foil, and these lead wires 5 are connected to the IC chip 6. The lead wires 5 on each tape carrier 4 is almost covered with a cover film not shown, but they are exposed at both ends of each tape carrier 4. On the other hand, the electrode terminals 2 are exposed at the edge portion of the liquid crystal panel 1. Each tape carrier 4 is connected at one end portion thereof to the edge portion of the liquid crystal panel 1 by placing the end portion of the tape carrier 4 on the edge portion of the liquid crystal panel 1 through an anisotropic conductive sheet not shown, aligning the electrode terminals 2 with the lead wires 5, and applying heat and pressure to thereby connect each electrode terminal 2 to the corresponding lead wire 5.

FIG. 1 shows a manner that five tape carriers 4 each having 100 output terminals are juxtaposed on the edge portion of the lower glass substrate 9 where 480 electrode terminals 2 are formed. As apparent from FIG. 1, specific two of the electrode terminals 2 which are adjacent to each other but are connected to any adjacent two of the five tape carriers 4 (i.e., two electrode terminals $2a$ and $2b$, $2c$ and $2d$, $2e$ and $2f$, or $2g$ and $2h$) are set in line symmetry. Further, owing to the fact that the total number, 500, of the output terminals that can be used on all the tape carriers 4 is greater than the total number, 480, of all the electrode terminals 2 connected, ten unused lead wires not connected are present on each of the leftmost one and the central one of the five tape carriers 4 as viewed in FIG. 1, and a portion of the central tape carrier 4 for forming the ten unused lead wires is formed as a lead pitch increased area 7 in which a pitch of the unused lead wires is locally increased. In this preferred embodiment, a pair of adjacent electrode terminals $2m$ and $2n$ respectively connected to a pair of lead wires $5a$ and $5b$ adjacent to each other with the lead pitch increased area 7 interposed therebetween are also set in line symmetry.

More specifically, angles A and B shown in FIG. 1 are set equal to each other to thereby make the electrode terminals $2a$ and $2b$ in symmetrical relationship with respect to a straight line L1 bisecting a distance between the two adjacent tape carriers 4. Similarly, angles C and D are set equal to each other to thereby make the electrode terminals $2c$ and $2d$ in symmetrical relationship with respect to a straight line L2; angles E and F are set equal to each other to thereby make the electrode terminals $2e$ and $2f$ in symmetrical relationship with respect to a straight line L3; and angles G and H are set equal to each other to thereby make the electrode terminals $2g$ and $2h$ in symmetrical relationship with respect to a straight line L4. Concretely, both the angles A and B are set to 29.5 degrees; both the angles C and D are set to 33.8 degrees; both the angles E and F are set to 40.6 degrees; and both the angles G and H are set to 25.5 degrees. To this end, a distance W1 between center lines of the two adjacent tape carriers 4 is set to 34.5 mm. Similarly, a distance W2 is set to 31.4 mm; a distance W3 is set to 28.0 mm; and a distance W4 is set to 38.1 mm.

Moreover, angles M and N shown in FIG. 1 are set equal to each other to thereby make the electrode terminals $2m$ and $2n$ in symmetrical relationship with respect to a straight line L5 bisecting a distance between the lead wires $5a$ and $5b$ adjacent to each other with the lead pitch increased area 7 interposed therebetween. Concretely, the distance between the lead wires $5a$ and $5b$ is set to 1.5 mm, and both the angles M and N are set to 83.1 degrees.

As described above, in this preferred embodiment, each pair of specific electrode terminals $2a$ and $2b$, $2c$ and $2d$, $2r$ and $2f$, $2g$ and $2h$, and $2m$ and $2n$ of all the electrode terminals 2 of the liquid crystal panel 1, each pair being adjacent to each other but possibly largely different in length in the related art, are formed in symmetrical relationship to be set equal in length, thereby eliminating a difference in wiring resistance. Therefore, the nonuniformity of display contrast due to the difference in wiring resistance is not generated between adjacent pixels formed by the adjacent electrode patterns 3 extended to the specific electrode terminals 2, thus realizing an improvement in display quality of the liquid crystal display. Further, owing to the fact that 90 to 100 electrode terminals 2 connected to each tape carrier 4 are so arranged as to converge toward the tape carrier 4, the lengths of any adjacent electrode terminals 2 connected to the common tape carrier 4 cannot be set equal to each other. However, a difference in length of the adjacent electrode terminals 2 connected to the common tape carrier 4 is very small, the nonuniformity of display contrast between the adjacent pixels is negligibly small.

Furthermore, in the above preferred embodiment, the angles A, B, C, D, E, F, G, and H are set so that A=B, C=D, E=F, and G=H in order to make equal the lengths of the specific electrode terminals 2 (the electrode terminals 2a and 2b, etc.) adjacent to each other but connected to any adjacent two tape carriers 4. However, even when the lengths of the adjacent electrode terminals 2 specified above are slightly different from each other, the nonuniformity of display contrast between the adjacent pixels is not visibly perceived. Therefore, even when the angles A to H are set so that A=29.6 degrees, B=29.8 degrees, C=34.6 degrees, D=33.6 degrees, E=40.9 degrees, F=40.4 degrees, G=25.5 degrees, and H=25.4 degrees, for example, the improvement in display quality can be expected. In this case, however, it is necessary to change each distance between the adjacent tape carriers 4 from that set in the above preferred embodiment.

In addition, as means for reducing the difference in wiring resistance between the adjacent electrode terminals 2, it may be considered to compensate the difference in length of the adjacent electrode terminals 2 by adjusting a thickness of each electrode terminal 2. In this case, however, complicated calculation must be made to obtain a required thickness of each electrode terminal 2. Further, there is a possibility that a desired thickness cannot be obtained depending on etching conditions. Accordingly, the setting of the lengths of the adjacent electrode terminals to substantially the same value as mentioned in the above preferred embodiment is simpler and more reliable as means for substantially eliminating the difference in wiring resistance.

As apparent from the above description, according to the present invention, the specific ones of the electrode terminals of the liquid crystal panel which are adjacent to each other but possibly largely different in length in the related art are set substantially equal in length, thereby almost eliminating a difference in wiring resistance. Therefore, the nonuniformity of display contrast due to the difference in wiring resistance is not generated between adjacent pixels formed by the adjacent electrode patterns extended to the specific electrode terminals. As a result, the display quality of the liquid crystal display can be improved.

While the invention has been described with reference to a specific embodiment, the description is illustrative and is not to be construed as limiting the scope of the invention. Various modifications and changes may occur to those skilled in the art without departing from the spirit and scope of the invention as defined by the appended claims.

What is claimed is:

1. In a liquid crystal display including a liquid crystal panel having a plurality of electrode patterns and a plurality of electrode terminals respectively extending from said electrode patterns, said electrode terminals being formed on an edge portion of said liquid crystal panel, and further including first, second and third tape carriers juxtaposed on said edge portion of said liquid crystal panel such that the second tape carrier is positioned between the first and third tape carriers, each of said tape carriers having an IC mounted thereon for driving said liquid crystal panel, said electrode terminals being connected to a plurality of lead wires formed on one end portion of said each tape carrier; the improvement wherein two adjacent ones of said electrode terminals respectively connected to said first and second tape carriers are substantially equal in length, and two adjacent ones of said electrode terminals respectively connected to said second and third tape carriers are substantially equal in length; wherein a clearance between the first and second tape carriers is different from a clearance between the second and third tape carriers.

2. A liquid crystal display according to claim 1, wherein said two adjacent electrode terminals respectively connected to said first and second adjacent tape carriers are formed in symmetrical relationship with respect to a straight line bisecting a distance between said first and second tape carriers tape carriers.

3. A liquid crystal display comprising:

a liquid crystal panel including a plurality of parallel electrode patterns separated by a common first spacing, the liquid crystal panel also including a plurality of electrode terminals formed along an edge thereto, each of the plurality of electrode terminals being connected to one of the electrode patterns, the plurality of electrode terminals being separated into first, second and third converging groups which are arranged such that a second spacing between adjacent electrode terminals of each of the first, second and third groups is smaller than the common first spacing; and first, second and third tape carriers respectively connected to first, second and third groups of electrode terminals, each of the first, second and third tape carriers including lead wires connected to the electrode terminals, each of the first, second and third tape carriers also having an IC mounted thereon for driving said liquid crystal panel through the lead wires;

wherein first and second adjacent electrode patterns are respectively connected to a first electrode terminal associated with the first group and a second electrode terminal associated with the second group;

wherein third and fourth adjacent electrode patterns are respectively connected to a third electrode terminal associated with the second group and a fourth electrode terminal associated with the third group; and wherein the first electrode terminal and the second electrode terminal have a common first length, the third electrode terminal and the fourth electrode terminal have a common second length, and the first length is longer than the second length.

4. The liquid crystal display of claim 3, wherein a distance between the first and second tape carriers is greater than a distance between the second and third tape carriers.

5. A liquid crystal display comprising:

a liquid crystal panel including a plurality of parallel electrode patterns separated by a common first spacing, the liquid crystal panel also including a plurality of electrode terminals formed along an edge thereof, each of the plurality of electrode terminals being connected to one of the electrode patterns, the plurality of electrode terminals being separated into first and second converging groups which are arranged such that a second spacing between adjacent electrode terminals of each of the first and second groups is smaller than the common first spacing; and a tape carrier connected to the first and second groups of electrode terminals, the tape carrier including first, second and third groups of lead wires positioned such that the second group of lead wires is positioned between the first and third groups of lead wires, each lead wire of the first group of lead wires being connected one electrode terminal of the first group of electrode terminals, each lead wire of the third group of lead wires being connected one electrode terminal of the second group of electrode terminals, and each lead wire of the second group of lead wires being electrically disconnected from the liquid crystal panel, the tape carrier also having an IC mounted thereon for driving said liquid crystal panel through the first and second groups of lead wires;

wherein first and second adjacent electrode patterns are respectively connected to a first electrode terminal associated with the first group of electrode terminals and a second electrode terminal associated with the second group of electrode terminals; and wherein the first electrode terminal and the second electrode terminal have a substantially common length.

6. A liquid crystal display according to claim 5, wherein said first and second electrode terminals are formed in symmetrical relationship with respect to a straight line bisecting the respective lead wires connected to said first and second electrode terminals.

* * * * *